United States Patent
Fassler et al.

[11] Patent Number: 6,022,152
[45] Date of Patent: Feb. 8, 2000

[54] NON-ABRASIVE PROCESSING OF PRINTING PLATES

[75] Inventors: Werner Fassler, Rochester; Charles D. DeBoer, Palmyra; John E. Mooney, Rochester, all of N.Y.

[73] Assignee: Eastman Kodak Company, Rochester, N.Y.

[21] Appl. No.: 09/206,913

[22] Filed: Dec. 7, 1998

[51] Int. Cl.[7] .................................................. G03D 5/06
[52] U.S. Cl. ........................ 396/606; 396/612; 118/244; 15/102
[58] Field of Search ............................... 396/606, 607, 396/608, 611, 936; 15/102; 430/300, 302; 118/244, 248, 249

[56] References Cited

U.S. PATENT DOCUMENTS

| | | | |
|---|---|---|---|
| 3,315,583 | 4/1967 | Hunt | 396/606 |
| 3,552,293 | 1/1971 | Cuthbert | 134/64 R |
| 3,626,833 | 12/1971 | Koch | 396/606 |
| 3,702,581 | 11/1972 | Speakman | 396/620 |

*Primary Examiner*—Alan A. Mathews
*Attorney, Agent, or Firm*—Raymond L. Owens

[57] ABSTRACT

A printing plate processor for processing a printing plate having a substrate, a hydrophilic layer over the substrate and a processable ink-receiving layer over the hydrophilic layer includes a structure for receiving processing fluid and a roller partially submerged in the processing fluid. The roller is rotated so that processing fluid coats the roller and is carried by surface tension around the roller, and the printing plate is moved into a processing region with the rotating roller but spaced from the roller a distance selected so that the turbulence of the processing fluid engaging the ink-receiving layer causes portions of the ink-receiving layer to be removed by the processing fluid carried on the roller.

7 Claims, 2 Drawing Sheets

NON-ABRASIVE PROCESSING OF PRINTING PLATES

FIELD OF THE INVENTION

This invention relates to printing plates which are hydrodynamically processed.

BACKGROUND OF THE INVENTION

The art of lithographic printing is based upon the immiscibility of oil and water, wherein the image area preferentially retains the oily material or ink. When a suitably prepared surface is moistened with water and ink is then applied, the background or non-image area retains the water and repels the ink while the image area accepts the ink and repels the water. The ink on the image area is then transferred to the surface of a material upon which the image is to be reproduced; such as paper, cloth and the like. Commonly the ink is transferred to an intermediate material called the blanket, which in turn transfers the ink to the surface of the material upon which the image is to be reproduced.

A very widely used type of lithographic printing plate has a light-sensitive coating applied to an aluminum base support. The coating may respond to light by having the portion that is exposed become soluble so that it is removed in the developing process. Such a plate is referred to as positive-working. Conversely, when the portion of the coating that is exposed becomes hardened, the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

In the field of preparing lithographic and photopolymer letterpress printing plates, light sensitive coatings are placed upon a support, usually a flexible, thin metal sheet, thus creating a presensitized printing plate. The plate is subjected to imagewise exposure through a mask which renders the photosensitive substance insoluble in a suitably chosen developer, if it is negative working; and soluble in the developer, if the plate is positive working. The action of the developer, in the case of a lithographic plate, is to remove the non-image portions of the plate coating completely so that no trace of it remains on the metal support. The metal support, so revealed, is now free of coating and will no longer accept ink. This sharp discrimination between image and non-image areas on the plate is vital to success in the preparation of a lithographic plate. Exposed lithographic plates may be developed by hand or by machine. If developed by hand, developer is poured both upon the plate and upon a soft sponge or pad and rubbed therewith upon the surface of the plate until, by inspection, the non-image areas are completely removed. Care must be taken to avoid any damage to the image by excessive rubbing, or by the use of an overly active chemical developer. When many plates are to be developed, machinery is used which will develop the plate by applying developer mechanically. In some existing machines, developer is metered to the plate through tubes and spread about by sponges or brushes which also serve to separate loosened non-image particles from the plate support. In a next stage, within the machine, the spent developer and separated non-image coating are rinsed from the plate, usually with water, supplied through tubes. In a final stage, the rinsed, moist surface is covered with a gum solution and any excess thereof is removed, thereby delivering a plate ready for the press or for storage. The gum solution is also metered to the plate through tubes. In some cases, these processing solutions are pumped through spray nozzles that are directed upon the plate surface.

Several different types of plate processors are available, differing primarily in the manner in which the plate is washed (rather than the manner of drying or post-curing). In one approach, the plate is moved through a washing region while the sprays from a large number of low-pressure spray nozzles are directed against the plate. The quality of the finished plates is good, but a large amount of surface foam is generated that is difficult to suppress. This machine can have a high throughput of plates, but is expensive to operate. Another plate processor uses reciprocating brushes to scrub away the unreacted photopolymer while the plates are passed through a shallow water bath. Most of the unreacted photopolymer material is removed, but the bristles may not be able to reach into small recesses, which may be smaller than the diameter of a single bristle. Unreacted photopolymer material may consequently be left on the surface of the printing plate, particularly in the small recesses of raised areas. The result is a buildup of ink between these raised areas during printing, and a progressive deterioration in print quality. The scrubbing action also can have the unfortunate side effect of damaging some of the polymerized areas, which desirably should not be affected by the washing, by rubbing away some of the polymerized material. The existing plate processors therefore produce plates that may have unremoved photopolymer or damage to the relief areas, both of which reduce print quality. In addition, they are large in size, using valuable floor space, and are costly to purchase and to operate.

U.S. Pat. No. 3,955,433 describes an automatic self-contained basic unit-processor for an offset photolithographic plate which may be used, at different times, for any processing step requiring contacting of the plate by liquid. For example, an exposed plate is developed by contacting the exposed surface of the plate with the conventional developing fluid, and subjecting the surface to a linear, reciprocating rubbing action by a sponge. This rubbing action is claimed to produce results surprisingly similar to those produced by a manual rotary rubbing action.

U.S. Pat. No. 3,943,539 describes a vertical plate processor, in which dwell time, brushing and squeegee for developing plates which are inserted vertically from the top of the processor between pairs of transport rollers and brush rollers and thereby immersed in a developing solution are provided. After a pre-set dwelling time, a drive motor is activated for rotating the rollers to deliver the plate up out of the processor. The processor provides automatic developing of the plate in a vertical, non-feedthrough operation, thereby permitting a compact apparatus requiring a minimum of table top space. Again, development is done by brushing with rollers.

U.S. Pat. No. 3,936,853 shows a processor in which the developer members may comprise either sponges or brushes mounted for engagement with the exposed surface of the lithographic plate, again requiring rubbing contact for the development process.

U.S. Pat. No. 3,937,175 describes machinery for the processing of exposed lithographic and photopolymer printing plates, wherein the plate is transported under spray heads through which developing solutions, rinses, and finishing solutions, as determined by the needs of the individual plate, are sequentially dispensed. Appropriate time intervals are provided for the action of each solution, optionally assisted by soft non-scratching brushes, scrubbing pads, squeegees and the like. The various manifolds to which the spray nozzles are attached are equipped with pumps and solenoid valves electrically actuated by a timer mechanism. The timer is adjusted to cause the valve to open and close rapidly. During the closed phase of the cycle, the fluid pressure builds up to the ultimate capability of the pump. Upon opening of the valve, the fluid, under pressure, is suddenly ejected upon the target to accomplish the impingement on and penetration into the target beyond that which would have been obtained with continuous spraying. The effects of this improved impingement and penetration are to clean out unwanted image areas more quickly and thoroughly while at the same time reducing the volume of needed developer.

U.S. Pat. No. 4,222,656 shows an apparatus for processing exposed lithographic plates in which an exposed plate is continuously fed forward with the exposed face of the plate facing up, developer is delivered onto the upper face of the plate by a nozzle which is traversed back and forth laterally with respect to the path of the plate above the plate to distribute the developer across the upper face of the plate, the developer is rubbed over the upper face of the plate, the plate is sprayed with water, preservative is delivered onto the upper face of the plate by a nozzle which is traversed back and forth along with the developer delivery nozzle to distribute the preservative across the upper face of the plate, and the preservative is rubbed over the upper face of the plate. The plate is fed forward by sets of plate feed rolls.

U.S. Pat. No. 5,349,413 describes a sheet-like material processing apparatus, in which there is no rubbing, but the solution is contained by squeeze rollers which contact the surface.

U.S. Pat. No. 5,223,041 Apparatus and process for processing printing plates using high pressure water spray water to the water spray nozzle under a pressure of from about 500 to about 1000 pounds per square inch.

Several different types of plate processors are available, differing primarily in the manner in which the plate is washed (rather than the manner of drying or post-curing). In one approach, the plate is moved through a washing region while the sprays from a large number of low-pressure spray nozzles are directed against the plate. The quality of the finished plates is good, but a large amount of surface foam is generated that is difficult to suppress. This machine can have a high throughput of plates, but is expensive to operate. Another plate processor uses reciprocating brushes to scrub away the unreacted photopolymer while the plates are passed through a shallow water bath. Most of the unreacted photopolymer material is removed, but the bristles may not be able to reach into small recesses, which may be smaller than the diameter of a single bristle. Unreacted photopolymer material may consequently be left on the surface of the printing plate, particularly in the small recesses of raised areas. The result is a buildup of ink between these raised areas during printing, and a progressive deterioration in print quality. The scrubbing action also can have the unfortunate side effect of damaging some of the polymerized areas, which desirably should not be affected by the washing, by rubbing away some of the polymerized material. The existing plate processors therefore produce plates that may have unremoved photopolymer or damage to the relief areas, both of which reduce print quality. In addition, they are large in size, using valuable floor space, and are costly to purchase and to operate.

U.S. Pat. No. 5,136,322 describes a light-sensitive material processing apparatus for processing an image-wise exposed light-sensitive material by immersing the light-sensitive material in a processing solution while the light-sensitive material is being automatically conveyed. The apparatus includes a scraping brush constituted by a shaft and a synthetic resin-made elongated brush wound spirally around an outer periphery of the shaft. Accordingly, the light-sensitive layer of the light-sensitive material is scraped off by the scraping brush to effect processing.

U.S. Pat. No. 4,555,302 shows a method and apparatus for etching light-sensitive photopolymerizable surfaces of printing plates. The apparatus includes a bath of etching fluid (32), a conveyor (38, 40, 42, 52) for conveying printing plates (10) in a prescribed path (54), and transducers (46) mounted above the plates as they are conveyed within the bath and capable of forming longitudinal waves in the etching fluid at generally right angles to the surface of the printing plates. The invention is characterized by directing processing fluid between the acoustical radiating surface of the transducers (46) and the surface of the plates (10) in such a manner that the surface to be etched is swept with processing fluid of a sufficient velocity and volume as to prevent substantial cavitational erosion of the surface to be etched.

U.S. Pat. No. 5,663,037 provides a direct write lithographic printing plate which is imaged by a high intensity laser beam, causing the exposed areas to become more soluble than the background when processed with a rotating brush in a processing solution.

There remains a need for a direct write lithographic printing plate that can be processing without rubbing contact.

SUMMARY OF THE INVENTION

An object of this invention is to provide a direct write lithographic printing plate that can be processing without rubbing contact.

This object is achieved by A printing plate processor for processing a printing plate having a substrate, a hydrophilic layer over the substrate and a processable ink-receiving layer over the hydrophilic layer, comprising:

a) a structure for receiving processing fluid;

b) a roller partially submerged in the processing fluid;

c) means for rotating the roller so that processing fluid coats the roller and is carried by surface tension around the roller; and d) means for providing relative movement between the printing plate and the structure so that the printing plate is positioned into a processing region with the rotating roller but spaced from the roller a distance selected so that there is turbulence of the processing fluid in the processing region where the turbulent fluid engages the ink-receiving layer and such turbulence causes portions of the ink-receiving layer to be removed by the processing fluid carried on the roller.

ADVANTAGES

An advantage of this invention is that the printing plate is only contacted by liquid and scratching and abrasion are much reduced.

Another advantage is that processing speed can be improved because of the turbulence of the processing fluid in the processing region.

DETAILED DESCRIPTION OF THE INVENTION

Figure 1:
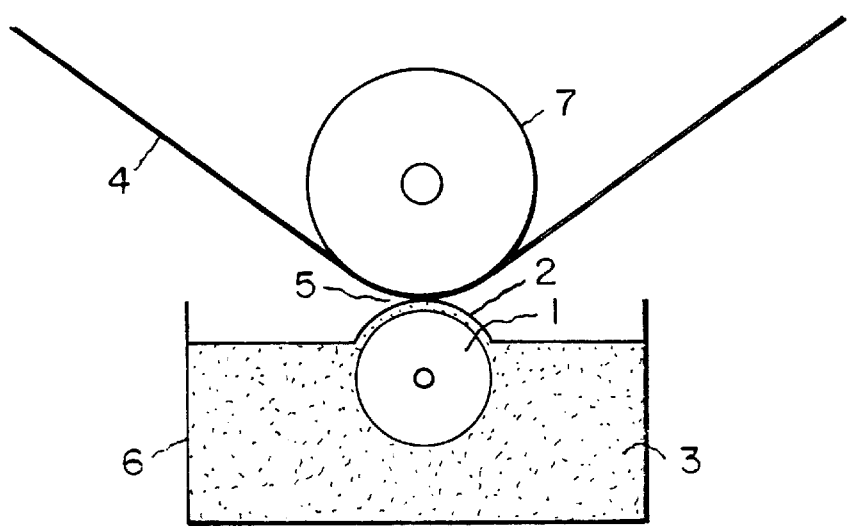
FIG. 1 the plate processing apparatus in accordance with the present invention.

FIG. 1 shows a rotating processing roller 1 partially submerged in the processing fluid 3 contained in a processing fluid receiving structure (tank) 6 spaced from a printing plate 4 to define a processing region 5. The processing fluid 3 includes a liquid, and at least one basic ingredient to raise the pH of the fluid to about 9 or higher. The processing roller 1, as it rotates, carries by surface tension a processing fluid coating 2 of processing fluid 3 to the processing region 5 where the fluid encounters the printing plate 4. The processing roller 1 or the roller surface is made from a material that can be wetted by the processing fluid 3. Such roller surface material can be selected from the group consisting of aluminum, Teflon, polyvinyl chloride, stainless steel, glass, and titanium, or any material that can be easily machined or molded. The processing fluid fills the processing region 5. The printing plate is transported by a slowly rotating printing plate transport roller 7, which can have an abrasive surface to prevent slippage of the plate. The liquid surface friction between the stationary or slowly moving printing plate 4 and the relatively rapidly rotating processing roller 1 will cause a great amount of turbulence and liquid shearing to remove exposed polymer from the printing plate 4. The processing roller 1 can be rotated either in the same direction as the motion of the printing plate or in the opposite direction. The processing roller 1 is driven by a processing roller motor, and the printing plate transport roller 7 is driven by a printing plate transport roller motor. Both motors are controlled by a computer. The computer can also receive a signal from a sensor which is representative of the position of the printing plate and times the position of the printing plate to be in the processing region. A sensor can be used to sense the color of the hydrophilic layer 12 to determine the extent of the removal of the processable ink-receiving layer 13. In response to these signals, the computer can adjust the speed of the motors so that they are at the appropriate speed levels to correctly remove the processable ink-receiving layer 13.

Figure 2:
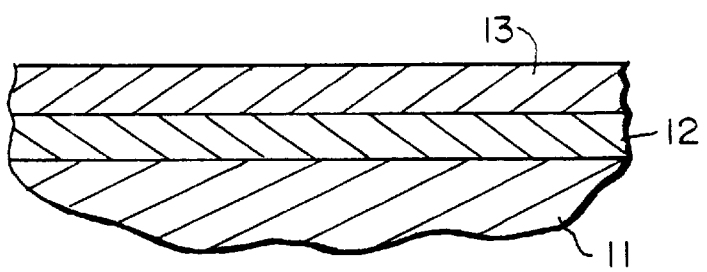
FIG. 2 shows a cross-section of an exposed printing plate.

FIG. 2 shows a cross section of an exposed printing plate having a substrate 11 with a hydrophilic layer 12 over the substrate, and a processable ink-receiving layer 13 over the hydrophilic layer 12. The substrate 11 can be a polymer, metal or paper foil, or a lamination of any of the three. The thickness of the support can be varied, as long as it is sufficient to sustain the wear of the printing press and thin enough to wrap around the printing form. A preferred embodiment uses polyethylene terephthalate in a thickness from 100 to 200 micrometers. Another preferred embodiment uses aluminum from 100 to 500 micrometers in thickness. The support should resist stretching so the color records will register in a full color image. The support may be coated with one or more "subbing" layers to improve adhesion of the final assemblage. The backside of the support may be coated with antistatic agents and/or slipping layers or matte layers to improve handling and "feel" of the litho plate. The hydrophilic layer 12 can be a thin, porous layer of aluminum oxide achieved by mechanically or electrolytically graining and anodizing the surface of an aluminum substrate. Alternatively, a hydrophilic layer can be coated on the substrate. For example, a layer of gelatin containing formaldehyde as a crosslinker and dispersed particles of titanium dioxide to provide a rough surface can be coated and dried on the substrate to provide a hydrophilic layer. The processable ink-receiving layer 13 can contain a resole resin and an orthoquinone diazide and, optionally, also contain a novolac resin for a positive-working printing plate. (With a positive-working printing plate, upon exposure the exposed areas are rendered more soluble, and upon development, are removed, leaving the unexposed areas covered with resin which takes ink in the lithographic printing process.) Resole resins are well known and widely available on a commercial basis. They are phenolic resins that are obtained by reaction of phenolic compounds with aldehydes. A typical example of a resole resin useful in this invention is a resin prepared from bis-phenol A and formaldehyde. A preferred resole resin that is available on a commercial basis is UCAR phenolic resin BKS-5928 which is available from Union Carbide Corporation. Novolac resins are also well known and widely used on a commercial basis. They are phenolic resins that are also obtained by reaction of phenolic compounds with aldehydes but under different reaction conditions than those that produce resole resins. A typical example of a novolac resin useful in this invention is a resin prepared from m-cresol and formaldehyde. A preferred novolac resin that is available on a commercial basis is N-9P NOVOLAK available from Eastman Kodak Company. Many other polymeric materials can be employed in the processable ink-receiving layer, depending on the chemical process being used. In each case, the corresponding processing fluid is employed to process the image in the apparatus of this invention. A negative-working printing plate, where exposure causes the exposed areas to harden and become insoluble or un-removeable by the processing fluid, generally employ a light sensitive unsaturated resin in the processable ink-receiving layer 13. An example of such an unsaturated resin is polyvinylcinnamate.

Figure 3:
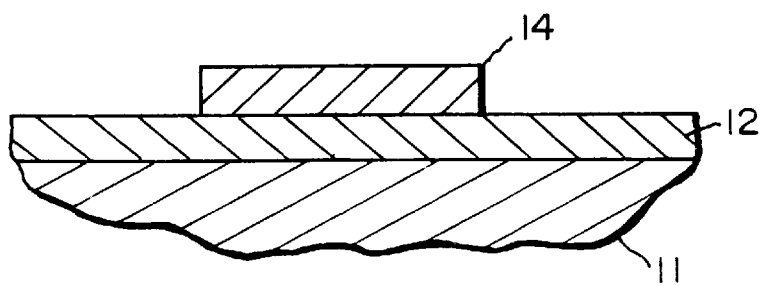
FIG. 3 shows a cross-section of the exposed printing plate of FIG. 2 after processing with the processing apparatus of this invention.

FIG. 3 shows a cross section of the exposed printing plate of FIG. 2 after processing with the processing apparatus of this invention. The unexposed background portions of the ink-receiving layer have been removed by the processing fluid carried on the roller. In this case, as is known to those skilled in the art, the printing plate is referred to as a negative working plate because the unexposed portions of the ink-receiving layer are removed. If a positive working plate were employed, the exposed portions of the ink-receiving layer would have been removed by the processing fluid carried on the roller. The processed printing plate can then be mounted on a printing press, where the plate is moistened with water and an ink is then applied, whereupon the background hydrophilic layer 12 retains the water and repels the ink while the processed ink-receiving layer 14 accepts the ink and repels the water. The ink on the image area is then transferred to the surface of a material upon which the image is to be reproduced; such as paper, cloth and the like. Commonly the ink is transferred to an intermediate material called the blanket, which in turn transfers the ink to the surface of the material upon which the image is to be reproduced.

Figure 4:
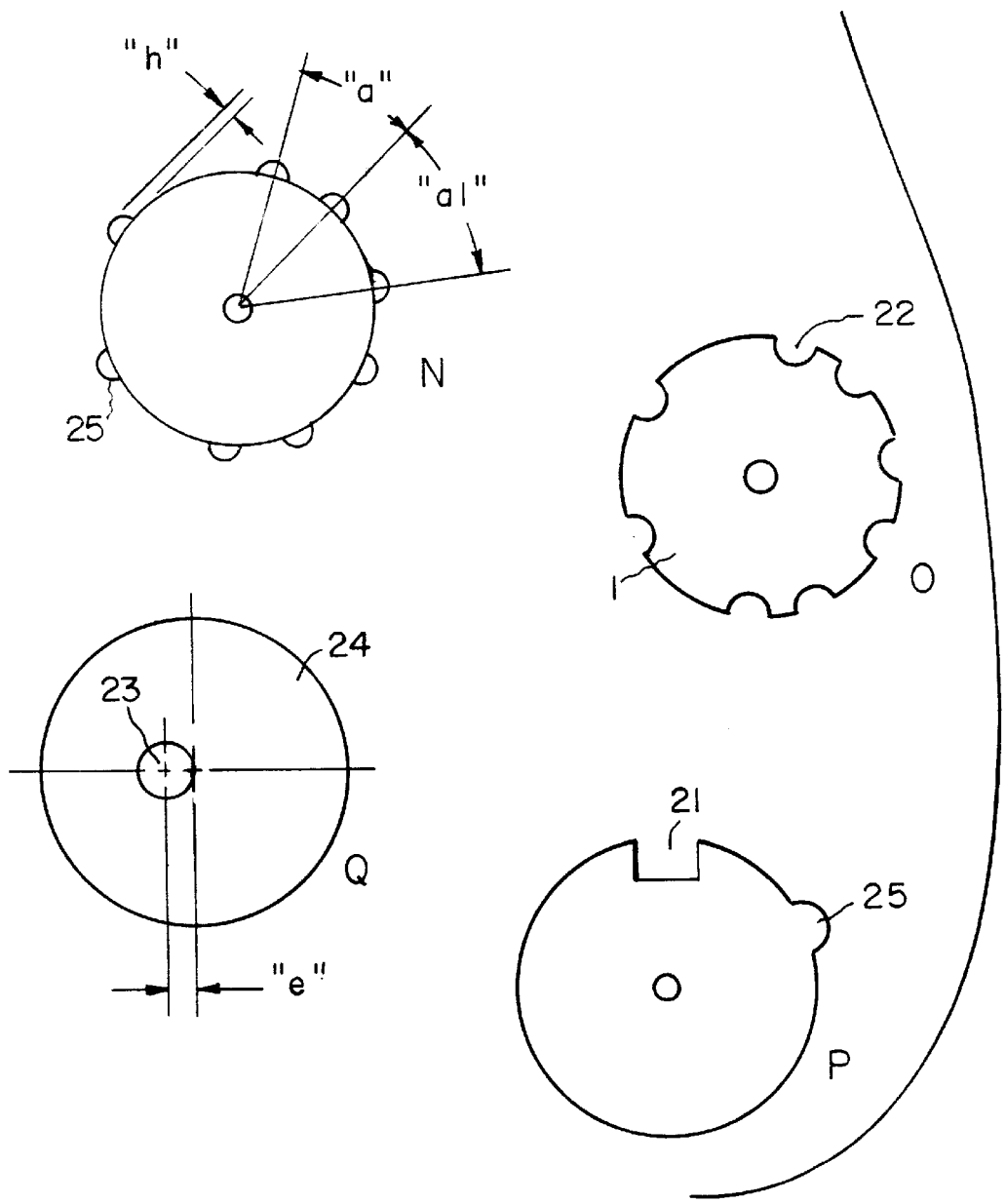
FIGS. 4M through Q shows a series of shaped processing rollers designed to increase the turbulence of the processing fluid in the processing region.

FIG. 4M through Q shows a series of shaped processing rollers designed to increase the turbulence of the processing fluid in the processing region. FIG. 4M shows a side view of a processing roller 1 mounted on a roller shaft 18. The processing roller has surface flats 19 which are produced by milling the surface of the roller in a symmetric fashion across the dimension "d1". The rotation of such a surface flat instead of a cylindrical roller creates pressure waves in the processing region 5 which results in more rapid removal of the background polymer of the printing plate. FIG. 4N shows another type of processing roller with domed protrusions 25 on the surface of the roller. The height of the protrusions, indicated by the dimension "h", may vary from place to place on the roller, and the spacing of the protrusions, indicated by the dimensions "a" and "a1" may also vary. In addition, the width of the protrusions may vary from the length of the roller to circular. FIG. 4O shows a processing roller 1 having rounded indents 22 in the surface of the roller. The depth of spacing of these indents 22 may vary from place to place on the roller. FIG. 4P shows a processing roller having both a domed protrusion 25 and a square indent 21 on the same roller. FIG. 4Q shows an eccentric roller 24, wherein the rotational center of the roller has an eccentric offset 23 from the geometric center indicated by the dimension "e". All of the processing rollers shown in FIGS. 4M through 4Q, and combinations and extensions of these ideas, are designed to optimize the turbulent flow of the processing fluid in the processing region of the apparatus of this invention to provide optimum removal of the background polymer of the lithographic printing plate.

In a preferred embodiment of the invention, the processing fluid is a commonly sold commercial cleaning fluid, such as FAINTASTIK spray cleaner (National Brands, Inc.). The processing fluid used in this invention can have a wide range of compositions. Both positive and negative working printing plates as described above are known to employ solutions of alkali metal silicates along with about 25 to 50% alkali metal hydroxide, with a silicate concentration from about 1 to 4%. Improved performance is found when nonionic fluorosurfactants are added, along with at least 6% of a water-soluble thickener such as glycerin. Other water soluble solvents can be added to the processing fluid if needed, such as alkyl alcohols of 1 to 4 carbon atoms such as methyl alcohol, ethyl alcohol, n-n-propyl alcohol, isopropyl alcohol, n-butyl alcohol, sec-butyl alcohol, tert-butyl alcohol, and isobutyl alcohol; amides such as dimethylformamide and dimethylacetamide; ketones or ketoalcohols such as acetone and diacetone alcohol; ethers such as tetrahydrofuran and dioxane; polyalkylene glycols such as polyethylene glycol and polypropylene glycol; alkylene glycols having 2 to 6 alkylene groups such as ethylene glycol, propylene glycol, butylene glycol, triethylene glycol, 1,2,6-hexanetriol, thiodiglycol, hexylene glycol, and diethylene glycol; and lower alkyl ethers of polyhydric alcohols such as glycerol, ethylene glycol methyl ether, diethylene glycol methyl (or ethyl) ether, and triethylene glycol monomethyl ether. Also, additives to control various properties of the processing fluid can be employed.

Examples of other additives are pH controlling agents, metal chelating agents, antifungal agents, viscosity controlling agents, surface tension controlling agents, wetting agents, surface active agents, and rust preventives.

The following example will illustrate the practice of this invention.

EXAMPLE 1

An Eastman Kodak Polymatic N lithographic printing plate was exposed to UV light in contact with a graphic arts imaged film. The plate was then processed in the apparatus of this invention, with a smooth aluminum roller. The processing fluid used was FANTASTIK spray cleaner. After two passes over the 16 mm diameter roller rotating at 300 rpm with a processing region gap of 600 microns, the background area of colored polymer had been removed, leaving a blue image on a clean gray background of grained anodized aluminum.

CONTROL EXAMPLE 2

A portion of the exposed plate of Example 1 was placed in a tray of FANTASTIK spray cleaner without agitation for the same length of time used for the two passes through the apparatus of Example 1. The polymer coating in the background area was only partially removed by this treatment.

The invention has been described in detail, with particular reference to certain preferred embodiments thereof, but it should be understood that variations and modifications could be effected with the spirit and scope of the invention.

PARTS LIST

| | |
|---|---|
| 1 | processing roller |
| 2 | processing fluid coating |
| 3 | processing fluid |
| 4 | printing plate |
| 5 | processing region |
| 6 | processing fluid receiving structure |
| 7 | printing plate transport roller |
| 11 | substrate |
| 12 | hydrophilic layer |
| 13 | processable ink-receiving layer |
| 14 | processed ink-receiving layer |
| 18 | roller shaft |
| 19 | surface flat |
| 21 | square indent |
| 22 | rounded indent |
| 23 | eccentric offset |
| 24 | eccentric roller |
| 25 | domed protrusion |

What is claimed is:

1. A printing plate processor for processing a printing plate having a substrate, a hydrophilic layer over the substrate and a processable ink-receiving layer over the hydrophilic layer, comprising:

a) a structure for receiving processing fluid;

b) a roller partially submerged in the processing fluid;

c) means for rotating the roller so that processing fluid coats the roller and is carried by surface tension around the roller; and d) means for providing relative movement between the printing plate and the structure so that the printing plate is positioned into a processing region with the rotating roller but spaced from the roller a distance selected so that there is turbulence of the processing fluid in the processing region where the turbulent fluid engages the ink-receiving layer and such turbulence causes portions of the ink-receiving layer to be removed by the processing fluid carried on the roller.

2. The printing plate processor of claim 1 wherein the roller has its surface shaped to provide increased turbulence of the processing fluid in the processing region.

3. The printing plate processor of claim 2 wherein the shaped surface includes flat regions, or raised regions, or indented regions, or combinations thereof.

4. The printing plate processor of claim 1 wherein the roller is rotated about an off-center axis.

5. The printing plate processor of claim 2 wherein the surface of the roller has flat portions which move into the processing region to increase the turbulence of the processing fluid.

6. The printing plate processor of claim 1 wherein the ink-receiving layer of the printing plate is a polymer which responds to actinic radiation to form developable images and wherein the processing fluid removes either exposed or unexposed portions of the ink-receiving layer to provide a developed image.

7. The printing plate processor of claim 6 wherein the processing fluid comprises water, metal alkali silicate, metal alkali hydroxide, a fluorosurfactant, at least 6% of a water-soluble thickener, and a water soluble solvent selected from the group consisting of methyl alcohol, ethyl alcohol, n-n-propyl alcohol, isopropyl alcohol, n-butyl alcohol, sec-butyl alcohol, tert-butyl alcohol, isobutyl alcohol, dimethylformamide, dimethylacetamide, acetone, diacetone alcohol, tetrahydrofuran, dioxane, polyethylene glycol, polypropylene glycol, ethylene glycol, propylene glycol, butylene glycol, triethylene glycol, 1,2,6-hexanetriol, thiodiglycol, hexylene glycol, diethylene glycol, glycerol, ethylene glycol methyl ether, diethylene glycol methyl (or ethyl) ether, and triethylene glycol monomethyl ether.

* * * * *